United States Patent
Krithivasan et al.

(10) Patent No.: US 9,848,510 B2
(45) Date of Patent: Dec. 19, 2017

(54) SOCKET LOADING ELEMENT AND ASSOCIATED TECHNIQUES AND CONFIGURATIONS

(71) Applicant: Intel Corporation, Santa Clara, CA (US)

(72) Inventors: Vijaykumar Krithivasan, Chandler, AZ (US); Jeffory L. Smalley, East Olympia, WA (US); David J. Llapitan, Tacoma, WA (US); Gaurav Chawla, Tempe, AZ (US); Mani Prakash, University Place, WA (US); Susan F. Smith, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 30 days.

(21) Appl. No.: 14/578,037

(22) Filed: Dec. 19, 2014

(65) Prior Publication Data

US 2016/0183375 A1  Jun. 23, 2016

(51) Int. Cl.
*H01L 23/32* (2006.01)
*H05K 7/20* (2006.01)
(Continued)

(52) U.S. Cl.
CPC ............ *H05K 7/2039* (2013.01); *H01L 23/32* (2013.01); *H01L 23/36* (2013.01); *H01L 23/40* (2013.01);
(Continued)

(58) Field of Classification Search
CPC ........ H05K 1/181; H05K 1/0203; H05K 3/32; H05K 7/20409; H05K 7/20418; H05K 7/20436; H05K 7/20445; H05K 7/20454; H05K 7/20472; H05K 7/20509; H05K 7/20518; H05K 7/20854; H05K 7/20963; H05K 7/20–7/2099; H05K 2201/10325; H05K 2201/10378; H05K 2201/1056; H05K 2201/10719; H05K 2201/066;
(Continued)

(56) References Cited

U.S. PATENT DOCUMENTS

| 6,449,162 | B1 * | 9/2002 | Corbin, Jr. | .......... H01L 23/4006 257/719 |
| 6,731,505 | B1 * | 5/2004 | Goodwin | ............ H01L 23/4093 24/458 |

(Continued)

OTHER PUBLICATIONS

Search Report dated Dec. 26, 2016 for Taiwanese Patent Application No. 104137885, 2 pages.

*Primary Examiner* — Zachary M Pape
*Assistant Examiner* — Amir Jalali
(74) *Attorney, Agent, or Firm* — Schwabe, Williamson & Wyatt, P.C.

(57) ABSTRACT

Embodiments of the present disclosure are directed towards a socket loading element and associated techniques and configurations. In one embodiment, an apparatus may include a loading element configured to transfer a compressive load from a heat spreader to a socket assembly, wherein the loading element is configured to form a perimeter around a die when the loading element is coupled with an interposer disposed between the die and the socket assembly and wherein the loading element includes an opening configured to accommodate the die. Other embodiments may be described and/or claimed.

20 Claims, 5 Drawing Sheets

(51) Int. Cl.
  *H01L 23/36* (2006.01)
  *H01L 23/40* (2006.01)
(52) U.S. Cl.
  CPC ............... *H01L 2924/0002* (2013.01); *H05K 2201/1056* (2013.01); *H05K 2201/10378* (2013.01)
(58) Field of Classification Search
  CPC .... H05K 2201/10393; H01L 23/49838; H01L 23/34–23/4735; H01L 21/4882; H01L 21/50; H01L 2023/4018; H01L 2023/4037; H01L 2023/4043; G06F 1/20; G06F 1/203; B23P 15/26
  USPC ....... 361/679.46–679.54, 688–723; 257/713, 257/717, 719
  See application file for complete search history.

(56) References Cited

U.S. PATENT DOCUMENTS

| | | | | |
|---|---|---|---|---|
| 7,323,358 B1* | 1/2008 | Cromwell | ........... | H01L 23/4093 257/678 |
| 7,385,825 B2* | 6/2008 | Xia | ..................... | H01L 23/4093 165/80.3 |
| 2004/0001318 A1* | 1/2004 | Ma | ..................... | H01L 23/4093 361/704 |
| 2005/0122690 A1* | 6/2005 | Hood | ................... | H01L 23/4093 361/709 |
| 2006/0261457 A1* | 11/2006 | Rancuret | ............ | H01L 23/4006 257/679 |
| 2007/0004242 A1* | 1/2007 | Pandey | ............... | H01L 23/4006 439/70 |
| 2008/0157349 A1* | 7/2008 | Szu | ..................... | H01L 23/4093 257/713 |
| 2009/0021917 A1* | 1/2009 | Floyd | ................. | H01L 23/4093 361/719 |
| 2013/0147028 A1* | 6/2013 | Su | .......................... | H01L 21/50 257/712 |
| 2014/0071647 A1* | 3/2014 | Bridges | ............... | H05K 7/1007 361/783 |
| 2014/0092547 A1* | 4/2014 | Boyd | .................... | H05K 3/301 361/679.32 |
| 2014/0162473 A1* | 6/2014 | Aoki | ..................... | H05K 3/301 439/68 |
| 2014/0224467 A1* | 8/2014 | Yokota | ................... | H01L 23/36 165/185 |
| 2016/0105974 A1* | 4/2016 | Boyd | .................... | H05K 3/301 29/834 |

\* cited by examiner

SOCKET LOADING ELEMENT AND ASSOCIATED TECHNIQUES AND CONFIGURATIONS

FIELD

Embodiments of the present disclosure generally relate to the field of integrated circuits, and more particularly, to a socket loading element and associated techniques and configurations.

BACKGROUND

An integrated heat spreader (IHS) may be configured to distribute a mechanical load across an integrated circuit (IC) package such as, for example, a processor package to ensure proper compression of socket contacts such as, for example, land-grid array (LGA) socket contacts. As processor packages and sockets have grown in size and complexity, IHSes for the processor packages may have grown proportionally, resulting in higher cost, challenges in manufacturing a larger IHS and challenges in distributing the mechanical load through the larger IHS.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe a socket loading element and associated techniques and configurations. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

Figure 1:
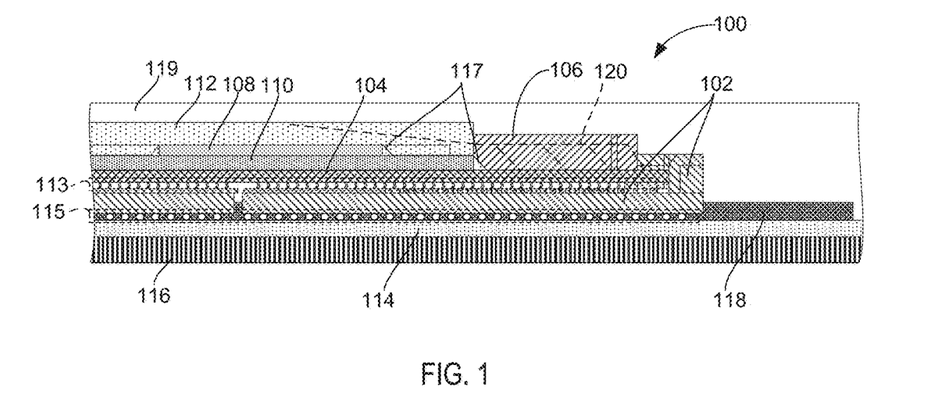
FIG. 1 schematically illustrates a perspective view of an example integrated circuit (IC) package assembly, in accordance with some embodiments.

FIG. 1 schematically illustrates a perspective view of an example integrated circuit (IC) package assembly 100, in accordance with some embodiments. According to various embodiments, the IC package assembly 100 may include a socket assembly 102, an interposer 104, a loading element 106, a die 108, a patch structure 110, an integrated heat spreader (IHS) 112, coupled as can be seen. In some embodiments, the IC package assembly 100 may further include a circuit board 114 coupled with the socket assembly 102, as can be seen. A back plate 116 and/or bolster plate 118 may be coupled with the circuit board 114 in some embodiments. An encapsulant 119 such as a molding compound or other suitable material may be disposed on the IC package assembly 100 to protect the components of the IC package assembly 100 from environmental hazards in some embodiments.

The loading element 106 may be configured to transfer a compressive, mechanical load from a heat spreader (e.g., IHS 112) to the socket assembly 102. For example, a mechanical load may be distributed across the IC package assembly 100 to ensure proper compression of socket contacts such as, for example, land-grid array (LGA) socket contacts (indicated within dashed region 113), which may include pin-like structures disposed in an array of openings in the socket assembly 102. An example pathway of the load is depicted by dashed lines 120. The load may pass from the IHS 112 to the loading element 106 and from the loading element 106 to the interposer 104 and/or socket assembly 102. In some embodiments, the socket assembly 102 or other suitable components of the IC package assembly 100 may include a fastening mechanism or other suitable mechanism that maintains the compressive load to hold the socket contacts (e.g., LGA socket contacts) against corresponding contacts on the interposer 104.

The loading element 106 may be composed of a wide variety of suitable materials including, for example, metal. In some embodiments, the loading element 106 may be formed from sheet metal (e.g., by stamping or bending). In one embodiment, the loading element 106 may be a unitary, contiguous material structure. The loading element 106 may be composed of other suitable materials in other embodiments.

According to various embodiments, the loading element 106 may be waged, press-fit, pinned and/or riveted to the IHS 112, prior to fabricating the IC package assembly 100. In some embodiments, the loading element 106 is permanently attached to the IHS 112. The loading element 106 may be coupled with the IHS 112 according to embodiments described in connection with FIGS. 2-6. For example, the loading element 106 may be configured to form a perimeter around the die 108 when the loading element 106 is coupled with the interposer 104 and may include an opening configured to accommodate the die 108.

In some embodiments, the loading element 106 may be coupled with the interposer 104 using an adhesive such as, for example, epoxy glue 117. For example, an adhesive may couple a bottom surface of the loading element 106 with a top surface of the interposer 104. In some embodiments, the loading element 106 is coupled to the interposer 104 in an area within a keep-out-zone (KOZ) designated for the patch structure 110. The loading element 106 may be coupled with the interposer 104 using other suitable techniques in other embodiments.

In some embodiments, the IHS 112 may be coupled with the die 108 and/or the patch structure 110 using an adhesive such as, for example, epoxy glue 117. For example, an adhesive such as a thermal interface material (TIM) may be used to couple a top surface of the die 108 with a bottom surface of the IHS 112, and an adhesive such as epoxy glue 117 may be used to couple a bottom surface of the IHS 112 with a top surface of the patch structure 110. The IHS 112 may be coupled with the die 108 and/or the patch structure 110 using other suitable techniques in other embodiments.

The patch structure 110 may include a substrate with electrical routing features to electrically couple the die 108 with the interposer 104. For example, the die 108 may be coupled with the patch structure 110 using first-level interconnect (FLI) structures such as, for example, bumps, pillars, and the like formed using reflow, thermocompression or other suitable techniques. In some embodiments, the die 108 and/or IHS 112 may be directly coupled with the interposer 104.

The interposer 104 may include electrical routing features to electrically couple the die 108 (e.g., through the patch structure 110) with the socket assembly 102. In some embodiments, the interposer 104 may include contacts (e.g., pads) configured to form an electrical connection with socket contacts (e.g., LGA socket contacts) of the socket assembly 102 when compressed together. The socket contacts may include, for example, electrical pins disposed in an array of corresponding openings in a socket housing of the socket assembly 102.

The socket assembly 102 may be configured to route electrical signals of the die 108 to the circuit board 114. In some embodiments, the socket assembly 102 may be coupled with the circuit board 114 using a plurality of second-level interconnect (SLI) structures (in dashed region 115) such as, for example, solder balls configured in a ball-grid array (BGA) configuration. The socket assembly 102 may be coupled with the circuit board 114 using other suitable techniques including, for example, other surface-mount technology (SMT) in other embodiments.

In some embodiments, the circuit board 114 may be coupled with a back plate 116 and/or a bolster plate 118. For example, in the depicted embodiment, the circuit board 114 is disposed between the back plate 116 and the bolster plate 118. The back plate 116 and the bolster plate 118 may provide local structural support to avoid local warpage of the circuit board 114. In some embodiments, the back plate 116 and the bolster plate 118 may be composed of anodized stainless steel or another suitable, rigid material.

Figure 8:
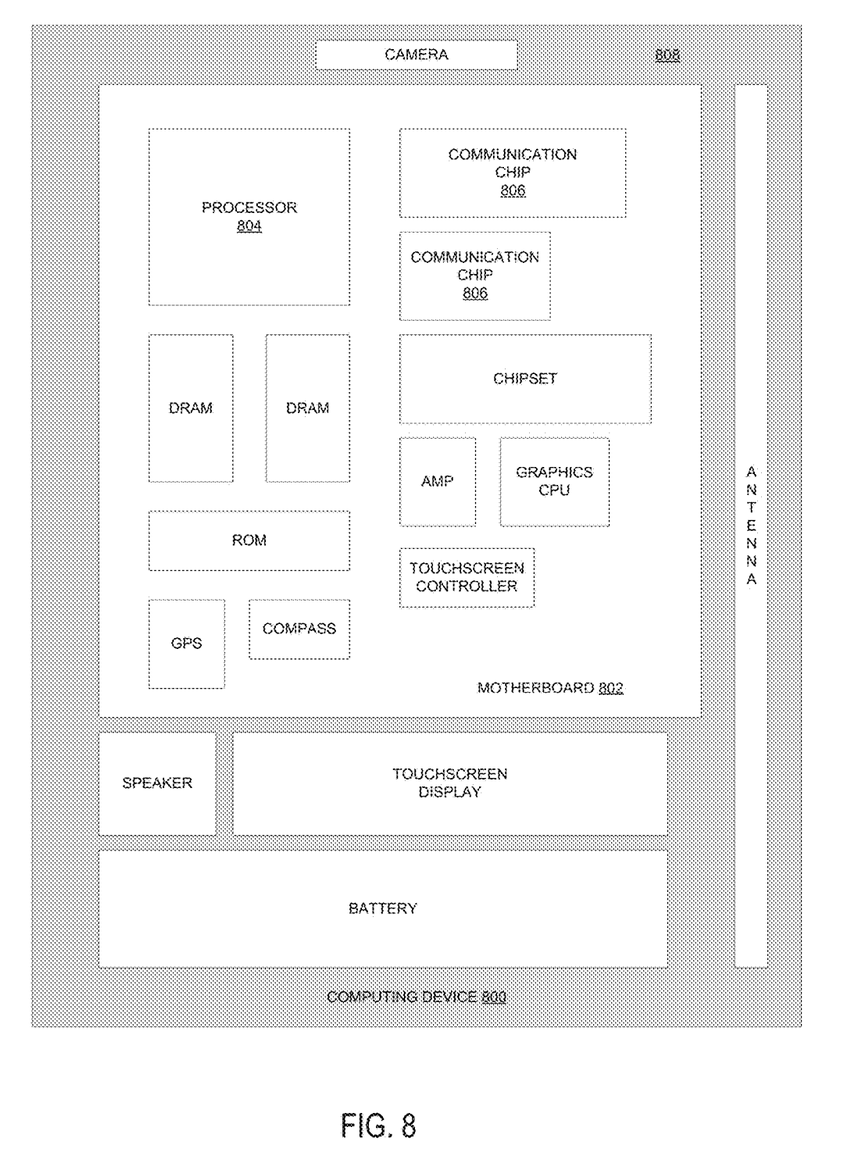
FIG. 8 schematically illustrates a computing device that includes an IC package assembly as described herein, in accordance with some embodiments.

According to various embodiments, the die 108 may represent a processor, the IC package assembly 100 may be a processor package assembly and the circuit board 114 may be a motherboard (e.g., motherboard 802 of FIG. 8). The IC package 100 may represent or include fabric or non-fabric packages, server or non-server packages, or other suitable packages according to various embodiments. The die 108 may represent and/or include other suitable devices in other embodiments.

Figure 2:
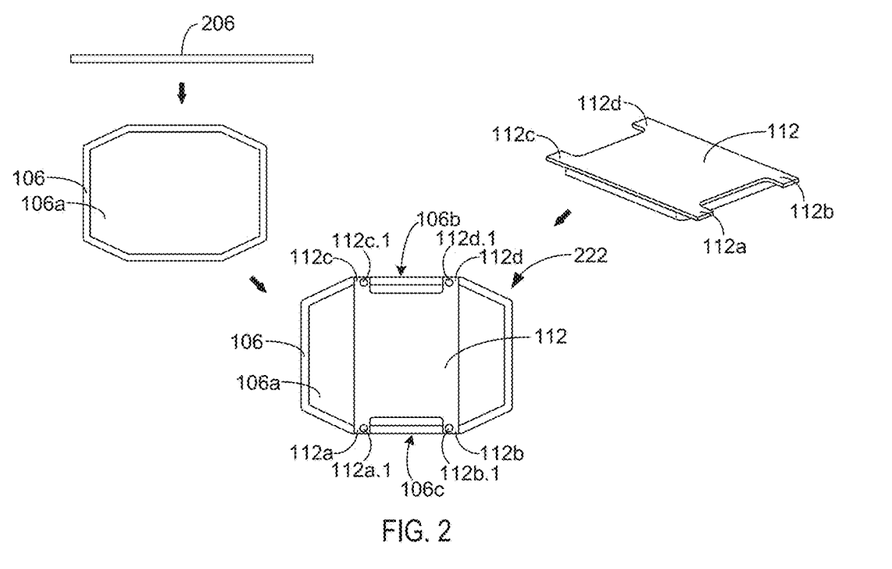
FIG. 2 schematically illustrates an assembly of a loading element with an integrated heat spreader (IHS), in accordance with some embodiments.

FIG. 2 schematically illustrates an assembly of a loading element 106 with an integrated heat spreader (IHS) 112, in accordance with some embodiments. According to various embodiments, the loading element 106 and the IHS 112 may comport with embodiments described in connection with FIG. 1 and vice versa.

In some embodiments, the loading element 106 may be formed by bending or stamping sheet metal 206 to provide a desired body profile. In the depicted embodiment, the loading element 106 has an octagonal profile. In other embodiments, the profile of the loading element 106 may include other suitable shapes including, for example, a rectangle, other polygons, annular or circular shapes, and/or combinations of linear and curved shapes. The loading element 106 may include an opening 106a to accommodate at least a die (e.g., die 108 of FIG. 1) and, in some embodiments, portions of the IHS 112 and/or patch structure (e.g., patch structure 110 of FIG. 1). For example, the loading element 106 may be configured to form a perimeter around the die when the loading element 106 is coupled with an interposer (e.g., interposer 104 of FIG. 1) disposed between the die and a socket assembly (e.g., socket assembly 102 of FIG. 1).

The loading element 106 may have opposing portions (e.g., portions 106b, 106c) across the opening 106a that are configured to make physical contact with (e.g., connect with) the IHS 112. The opposing portions (e.g., portions 106b, 106c) may run parallel or substantially parallel to one another. For example, the IHS 112 may be formed (e.g., stamped) to include extensions (which may be referred to as "wings") 112a-d that are configured to overlay and connect with the opposing portions, as can be seen. The extensions 112a-d may overlay a top surface of the loading element 106 such that when a load is applied to the IHS 112, the load is transferred to the loading element 106. The extensions 112a-d may be disposed at corners of the IHS 112 to better distribute the load relative to more adjacent regions between the corners of the IHS 112. In some embodiments, a reaction force exerted by the loading element 106 on the IHS 112 may be a sum total of forces on each of the extensions 112a-d. The IHS 112 may include more or fewer extensions in other embodiments.

The extensions 112a-d may be formed to extend away from the main body of the IHS 112. For example, in the depicted embodiment, the extensions 112a-d are disposed at a first end and opposing second end of the IHS 112, as can be seen. The extensions 112a-d may extend in opposite directions away from the main body of the IHS 112. Connection points 112a.1, 112b.1, 112c.1 and 112d.1 may represent any suitable fastening structure to couple the opposing portions of the loading element 106 with corresponding extensions 112a, 112b, 112c, and 112d of the IHS 112 including, for example, rivets, swages, press-fit features, pins or other suitable structures.

In some embodiments, the IHS 112 may be permanently affixed to the loading element 106. In some embodiments, coupling of the IHS 112 with the loading element 106 may provide a single assembly 222. The single assembly 222 may be formed prior to coupling the single assembly 222 with other components of the IC package assembly 100 of FIG. 1. In other embodiments, the IHS 112 and the loading element may be separately formed and independently coupled with other components of the IC package assembly 100 of FIG. 1.

Figure 3A:
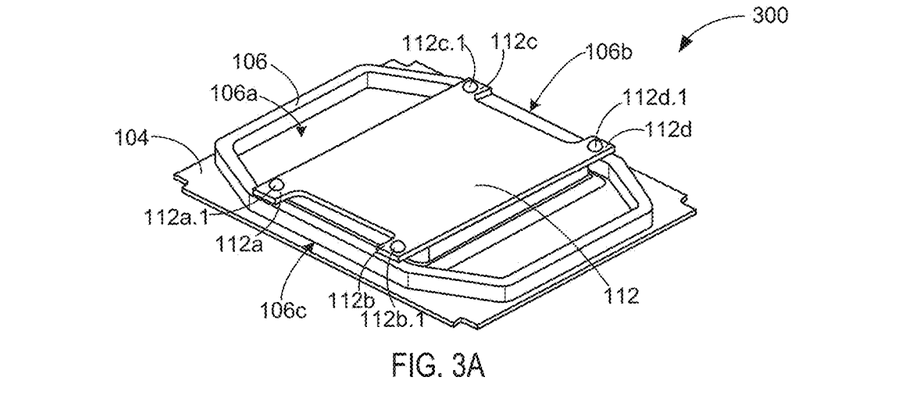
FIG. 3A schematically illustrates a perspective view of a loading element and IHS disposed on an interposer, in accordance with some embodiments.

FIG. 3A schematically illustrates a perspective view of a loading element 106 and IHS 112 disposed on an interposer 104, in accordance with some embodiments. According to various embodiments, an assembly 300 may include the IHS 112 coupled with the loading element 106, the loading element 106 coupled with the interposer 104.

In some embodiments, the loading element 106 may have an octagonal profile, as can be seen. Different shapes may affect a bending mode of the loading element 106 when a socket assembly is loaded (e.g., when a compressive load is applied to the IHS 112 of FIG. 1). The octagonal shape may provide a near-spherical bend mode, which may be desirable to deliver a uniform contact force distribution and/or deflection. The loading element 106 may have other suitable profile shapes in other embodiments.

In some embodiments, the loading element 106 is configured to deliver a minimum contact force greater than or equal to 10 gram-force (gf). The minimum contact force may be a threshold for contact force exerted by the socket contacts on pads of the interposer 104 to be electrically functional. In some embodiments, the loading element 106 is configured to deliver a minimum contact force greater than or equal to 14 gf. In some embodiments, the loading element 106 is configured to provide a seating plane stress less than or equal to 12.5 megapascals (MPa). The seating plane stress may be a force exerted by the package (e.g., interposer 104 and components coupled with the interposer) on the socket body of the socket assembly 102.

In some embodiments, the loading element 106 may be coupled directly with the interposer 104 using, for example, an adhesive such as an epoxy material. Although not shown, the assembly 300 may further include a die (e.g., die 108 of FIG. 1) coupled with the IHS 112. In some embodiments, the die may be directly coupled with the interposer 104 using, for example, FLI structures. In other embodiments, the assembly 300 may further include a patch structure (e.g., patch structure 110 of FIG. 1) coupled with the die, and the patch structure may be coupled with the interposer 104 using suitable interconnect structures such as, for example, SLI structures. The interposer 104 may be coupled with a socket assembly (e.g., socket assembly 102 of FIG. 1) as described in connection with FIG. 1.

Figure 3B:
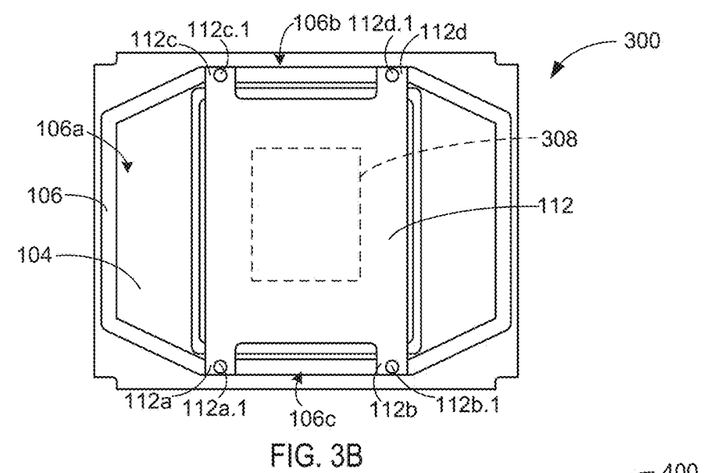
FIG. 3B schematically illustrates a top view of a loading element and IHS disposed on an interposer, in accordance with some embodiments.

FIG. 3B schematically illustrates a top view of a loading element 106 and IHS 112 disposed on an interposer 104, in accordance with some embodiments. In the assembly 300 of FIG. 3B, a die shadow 308 is depicted in dashed form to indicate a perimeter of a die that underlies the IHS 112. As can be seen, the loading element 106 is configured to form a perimeter around the die. The opening 106a of the loading element 106 is configured to accommodate the die. That is, in the top view, the die shadow 308 is disposed within the perimeter formed by the loading element 106, as can be seen. The die shadow 308 may be larger or smaller than depicted according to various embodiments.

Figure 4:
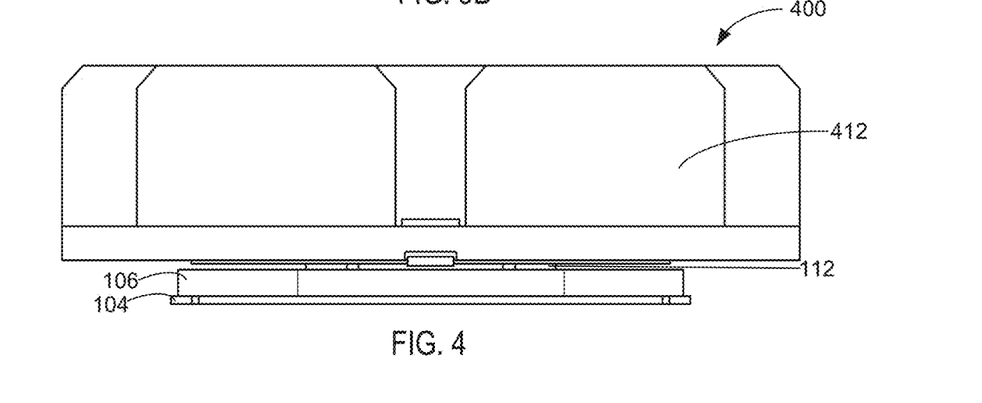
FIG. 4 schematically illustrates a side view of a loading element, IHS and heat sink disposed on an interposer, in accordance with some embodiments.

FIG. 4 schematically illustrates a side view of a loading element 106, IHS 112 and heat sink 412 disposed on an interposer 104, in accordance with some embodiments. According to various embodiments, the loading element 106, IHS 112 and interposer 104 may be coupled according to techniques and configurations described in connection with FIGS. 1-3B.

In assembly 400, the heat sink 412 may be coupled (e.g., thermally attached) with the IHS 112 to further route heat away from the die when the die is in operation. In some embodiments, a distance between the heat sink 412 and the loading element 106 is about 1 millimeter (mm) or less. The heat sink 412 may include a vapor chamber or any other suitable heat transfer technology.

The load from the heat sink 412 may be transferred to the IHS 112, which may transfer the load to the loading element 106, which may transfer the load to the interposer 104 and/or socket assembly (e.g., socket assembly 102 of FIG. 1). In some embodiments, the interposer 104 may transfer at least a portion of the load to the socket assembly. The loading element 106 may be glued or otherwise mechanically coupled to interposer 104, and the IHS 112 may be glued or otherwise mechanically coupled to the patch structure, which may be coupled to the interposer using interconnects such as, for example, surface-mount technology (SMT) structures.

Figure 5:
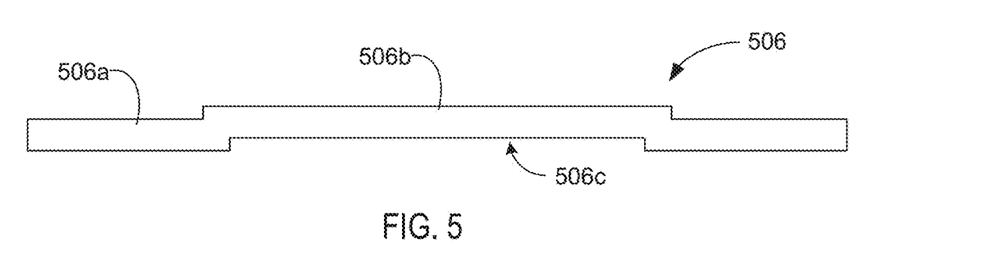
FIG. 5 schematically illustrates a side view of a loading element, in accordance with some embodiments.

FIG. 5 schematically illustrates a side view of a loading element 506, in accordance with some embodiments. The loading element 506 may comport with embodiments described in connection with loading element 106 and vice versa.

In some embodiments, a portion 506b of the loading element 506 may be elevated relative to a portion 506a of the loading element 506 that is configured to mechanically couple with the interposer to provide an area 506c where the loading element 506 does not contact the interposer. For example, the area 506c may correspond with a keep-out zone (KOZ) such as an epoxy KOZ for the patch structure on the interposer. The portion 506b may be formed, for example, by bending the material of the loading element 506 or other suitable technique.

Figure 6A:
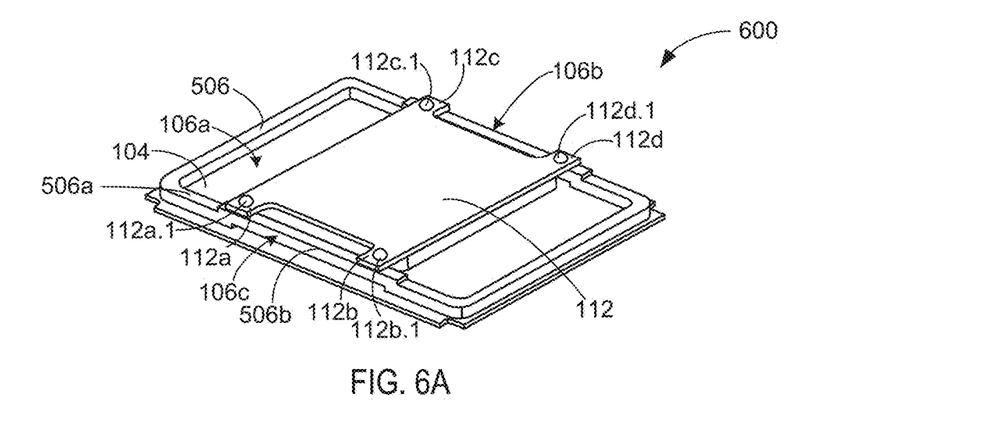
FIG. 6A schematically illustrates a perspective view of a loading element and IHS disposed on an interposer, in accordance with some embodiments.
Figure 6B:
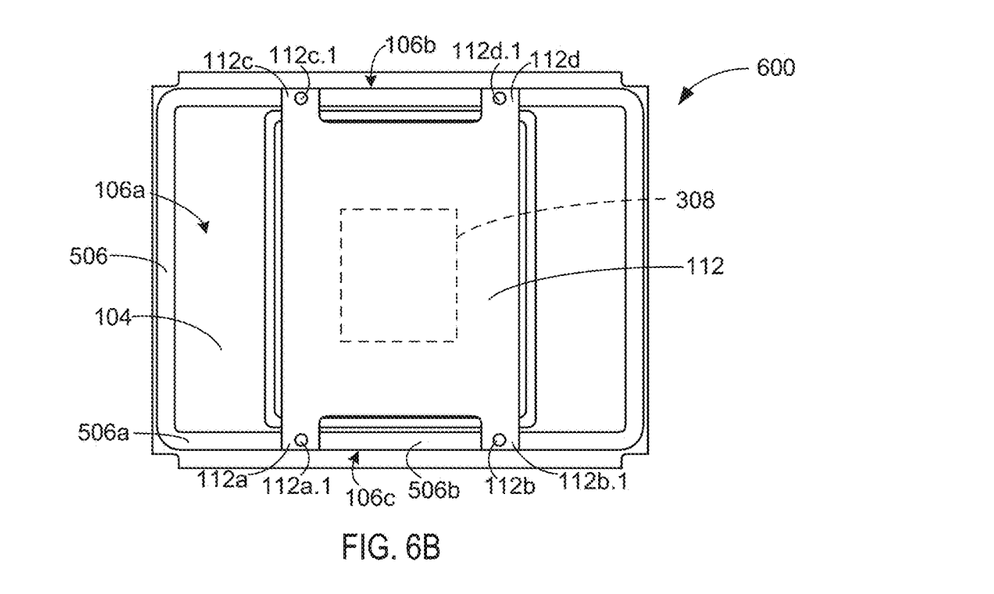
FIG. 6B schematically illustrates a top view of a loading element and IHS disposed on an interposer, in accordance with some embodiments.

FIG. 6A schematically illustrates a perspective view of a loading element 506 and IHS 112 disposed on an interposer 104, in accordance with some embodiments. FIG. 6B schematically illustrates a top view of the loading element 506 and IHS 112 disposed on the interposer 104, in accordance with some embodiments. The assembly 600 depicted in FIGS. 6A-B may comport with embodiments described in connection with assembly 300 of FIGS. 3A-B, except that in FIGS. 6A-B, the loading element 506 has a rectangular profile and an elevated portion (e.g., portion 506b of FIG. 5).

A rectangular profile may be more cost-effective to manufacture relative to the octagonal profile and may still effectively transfer load from the IHS to the interposer and/or socket assembly, according to various embodiments. The rectangular profile may also provide more area for including of topside memory modules on the die package. The loading element 506 may have other suitable profile shapes in other embodiments. The elevated portion 506b may prevent physical contact between the loading element 506 and the interposer 104 in a designated KOZ on the interposer 104.

A wide variety of suitable combinations of embodiments are envisioned within the scope of this disclosure. For example, the loading element 506 may have other shapes in other embodiments including, for example, an octagonal profile. A loading element having a rectangular profile may not have an elevated portion (e.g., portion 506b of FIG. 5) in some embodiments.

Figure 7:
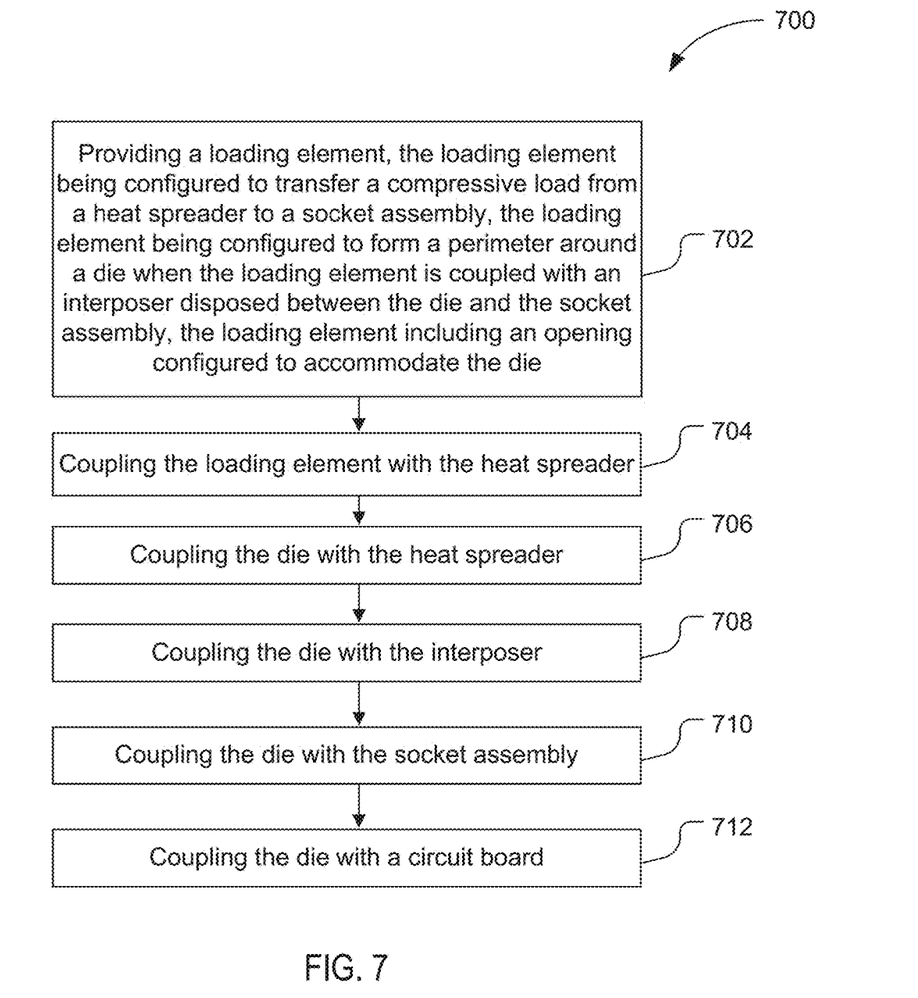
FIG. 7 schematically illustrates a flow diagram for a method of fabricating an IC package assembly, in accordance with some embodiments.

FIG. 7 schematically illustrates a flow diagram for a method 700 of fabricating an IC package assembly (e.g., IC package assembly 100 of FIG. 1), in accordance with some embodiments. The method 700 may comport with embodiments described in connection with FIGS. 1-6 and vice versa.

At 702, the method 700 may include providing a loading element (e.g., loading element 106 of FIG. 2), the loading element being configured to transfer a compressive load (e.g., load path depicted by dashed lines 120 of FIG. 1) from a heat spreader (e.g., IHS 112 of FIG. 1) to a socket assembly (e.g., socket assembly 102 of FIG. 1), the loading element being configured to form a perimeter around a die (e.g., die 108 of FIG. 1 or die shadow 308 of FIG. 3B) when the loading element is coupled with an interposer (e.g., interposer 104 of FIG. 1 or 3B) disposed between the die and the socket assembly, the loading element including an opening (e.g., opening 106a of FIGS. 2, 3A-B, 6A-B) configured to accommodate the die.

At 704, the method 700 may include coupling the loading element with the heat spreader. For example, the loading element and the heat spreader may be coupled according to embodiments described in connection with FIG. 2.

At 706, the method 700 may include coupling the die with the heat spreader. For example, in some embodiments, a surface (e.g., a backside) of the die may be thermally coupled with a main body of the heat spreader using a thermal interface material.

At 708, the method 700 may include coupling the die with the interposer. For example, in some embodiments, the die may be physically and/or electrically coupled with a patch structure (e.g., patch structure 110 of FIG. 1). A bottom surface of the IHS may be coupled with the patch structure in some embodiments using, for example, an adhesive. The patch structure may be physically and/or electrically coupled with the interposer using electrical contacts that are configured to route electrical signals of the die from the patch to the interposer. In other embodiments, the die may be physically and/or electrically coupled with the interposer directly (e.g., without a patch structure) using, for example, FLI structures.

At 710, the method 700 may include coupling the die with the socket assembly. For example, in some embodiments, a load may be applied to the heat spreader to compress an assembly including the heat spreader, the loading element, the die and/or the interposer towards the socket assembly to establish electrical connections between contacts on the interposer and socket contacts of the socket assembly. The contacts on the interposer and the socket contacts may be configured to route the electrical signals (e.g., input/output and/or power/ground) of the die.

At 712, the method 700 may include coupling the die with a circuit board (e.g., circuit board 114 of FIG. 1). The die may be electrically coupled with the circuit board using, for example, SLI structures or other suitable structures to form electrical connections between the interposer and the circuit board. In some embodiments, the circuit board may be a motherboard.

Various operations are described as multiple discrete operations in turn, in a manner that is most helpful in understanding the claimed subject matter. However, the order of description should not be construed as to imply that these operations are necessarily order dependent. For example, the actions of method 700 may be performed in any suitable order according to various embodiments.

Embodiments of the present disclosure may be implemented into a system (e.g., computing device 800 of FIG. 8) using any suitable hardware and/or software to configure as desired. FIG. 8 schematically illustrates a computing device 800 that includes an IC package assembly (e.g., IC package assembly 100 of FIG. 1) as described herein, in accordance with some embodiments. The computing device 800 may house a board such as motherboard 802 (e.g., in housing 808). The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., dynamic random access memory (DRAM)), non-volatile memory (e.g., read only memory (ROM)), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth, and a second communication chip 806 may be dedicated to longer range wireless communications such as GPS, EDGE, GPRS, CDMA, WiMAX, LTE, EV-DO, and others.

The processor 804 of the computing device 800 may be packaged in an IC package assembly (e.g., IC package assembly 100 of FIG. 1) as described herein. For example, the circuit board 114 of FIG. 1 may be a motherboard 802 and the processor 804 may be a die 108 of FIG. 1 that is coupled with a heat spreader (e.g., IHS 112 of FIG. 1), the heat spreader being coupled with a loading element 106 of FIG. 1 of a socket assembly 102 of FIG. 1 that is coupled with the circuit board 114 as described herein. Other suitable configurations may be implemented in accordance with embodiments described herein. The term "processor" may refer to any device or portion of a device that processes electronic data from registers and/or memory to transform that electronic data into other electronic data that may be stored in registers and/or memory.

The communication chip 806 may also include a die that may be packaged in an IC package assembly (e.g., IC package assembly 100 of FIG. 1) as described herein. In further implementations, another component (e.g., memory device or other integrated circuit device) housed within the computing device 800 may include a die that may be packaged in an IC package assembly (e.g., IC package assembly 100 of FIG. 1) as described herein.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 800 may be a mobile computing device in some embodiments. In further implementations, the computing device 800 may be any other electronic device that processes data.

EXAMPLES

According to various embodiments, the present disclosure describes an apparatus comprising. Example 1 of an apparatus may include a loading element configured to transfer a compressive load from a heat spreader to a socket assembly, wherein the loading element is configured to form a perimeter around a die when the loading element is coupled with an interposer disposed between the die and the socket assembly and wherein the loading element includes an opening configured to accommodate the die. Example 2 may include the apparatus of Example 1, wherein opposing portions of the loading element are configured to make physical contact with the heat spreader. Example 3 may include the apparatus of Example 1, wherein the loading element is composed of a metal. Example 4 may include the apparatus of Example 1, wherein the loading element has a rectangular or octagonal profile. Example 5 may include the apparatus of any of Examples 1-4, further comprising the heat spreader, wherein the heat spreader includes an extension at a first end and second end of the heat spreader, the extension at the first end and the extension at the second end in direct physical contact with opposing portions of the loading element, the first end opposite to the second end. Example 6 may include the apparatus of Example 5, wherein the heat spreader is an integrated heat spreader (IHS). Example 7 may include the apparatus of Example 5, further comprising the die coupled with the heat spreader. Example 8 may include the apparatus of Example 7, further comprising the interposer, wherein the die is electrically coupled with the interposer. Example 9 may include the apparatus of Example 8, further comprising the socket assembly, wherein the die is electrically coupled with land-grid array (LGA) socket pins of the socket assembly through the interposer. According to various embodiments, the present disclosure describes a method. Example 10 of a method may include providing a loading element and coupling the loading element with a heat spreader, the loading element being configured to transfer a compressive load from the heat spreader to a socket assembly, wherein the loading element is configured to form a perimeter around a die when the loading element is coupled with an interposer disposed between the die and the socket assembly and wherein the loading element includes an opening configured to accommodate the die. Example 11 may include the method of Example 10, wherein providing the loading element comprises forming the loading element from sheet metal by stamping or bending the sheet metal. Example 12 may include the method of Example 10, wherein coupling the loading element with the heat spreader comprises using a rivet, swage, or press-fit technique. Example 13 may include the method of Example 10, wherein coupling the loading element with the heat spreader comprises coupling an extension on a first end and second end of the heat spreader with opposing portions of the loading element, the first end opposite to the second end. Example 14 may include the method of any of Examples 10-13, further comprising coupling the die with the heat spreader. Example 15 may include the method of any of Examples 10-13, further comprising electrically coupling the die with the interposer. Example 16 may include the method of any of Examples 10-13, further comprising electrically coupling the die with land-grid array (LGA) socket pins of the socket assembly. Example 17 may include the method of any of Examples 10-13, further comprising electrically coupling the die with a motherboard. According to various embodiments, the present disclosure describes a system. Example 18 of a system may include a circuit board and a package assembly coupled with the circuit board, the package assembly including a loading element configured to transfer a compressive load from a heat spreader to a socket assembly, wherein the loading element is configured to form a perimeter around a die when the loading element is coupled with an interposer disposed between the die and the socket assembly and wherein the loading element includes an opening configured to accommodate the die. Example 19 may include the system of Example 18, further comprising the heat spreader, wherein the heat spreader includes an extension on a first end and second end of the heat spreader, the extension on the first end and the extension on the second end in direct physical contact with opposing portions of the loading element, the first end opposite to the second end, the die coupled with the heat spreader, the interposer, wherein the die is electrically coupled with the interposer through a patch structure, and the socket assembly, wherein the die is electrically coupled with socket contacts of the socket assembly through the interposer. Example 20 may include the system of any of Examples 18-19, wherein the circuit board is a motherboard and the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
    a loading element having a profile with at least four connected portions to form an opening to accommodate a die of the apparatus when the loading element is coupled with a socket assembly of the apparatus; and
    a heat spreader disposed on the loading element, wherein the heat spreader forms a body having extensions disposed at opposing ends of the body and extending away from the body, wherein the extensions overlay a top surface of the profile of the loading element to couple with respective opposing portions of the loading element, wherein the loading element is to transfer a compressive load from the heat spreader to the socket assembly.

2. The apparatus of claim 1, wherein the opposing portions of the loading element are to make physical contact with the heat spreader.

3. The apparatus of claim 1, wherein the loading element is composed of a metal.

4. The apparatus of claim 1, wherein the profile of the loading element is octagonal.

5. The apparatus of claim 1, wherein the extensions at a first end of the body of the heat spreader and the extensions at a second end of the body of the heat spreader are in direct physical contact with the opposing portions of the loading element, wherein the first end is opposite the second end.

6. The apparatus of claim 5, wherein the heat spreader is an integrated heat spreader (IHS).

7. The apparatus of claim 5, wherein the die is coupled with the heat spreader.

8. The apparatus of claim 7, further comprising an interposer, wherein the die is electrically coupled with the interposer.

9. The apparatus of claim 8, wherein the die is electrically coupled with land-grid array (LGA) socket pins of the socket assembly through the interposer.

10. A method comprising: providing a loading element having a profile with at least four connected portions to form an opening to accommodate a die and to transfer a compressive load from a heat spreader to a socket assembly; and coupling the loading element with the heat spreader, the heat spreader forming a body having extensions disposed at opposing ends of the body and extending away from the body, wherein the coupling includes disposing the extensions on a top surface of the profile of the loading element, and connecting the extensions with respective opposing portions of the loading element.

11. The method of claim 10, wherein providing the loading element comprises:
    forming the loading element from sheet metal by stamping or bending the sheet metal.

12. The method of claim 10, wherein the coupling of the loading element with the heat spreader comprises using a rivet, swage, or press-fit technique.

13. The method of claim 10, wherein coupling the loading element with the heat spreader comprises coupling the extensions on first and second ends of the heat spreader with a first portion of the loading element, and coupling the extensions on third and fourth ends of the heat spreader with a second portion of the loading element, wherein the first portion is opposite the second portion, wherein the first and second ends are opposite the third and fourth ends.

14. The method of claim 10, further comprising coupling the die with the heat spreader.

15. The method of claim 14, further comprising electrically coupling the die with an interposer.

16. The method of claim 15, further comprising electrically coupling the die with the socket assembly, including coupling the die with land-grid array (LGA) socket pins of the socket assembly.

17. The method of claim 16, further comprising electrically coupling the die with a motherboard.

18. A system comprising:
a circuit board; and
a package assembly coupled with the circuit board, the package assembly including:
a loading element to transfer a compressive load from a heat spreader to a socket assembly of the system, wherein the loading element has a profile with at least four connected portions to form an opening to accommodate a die when the loading element is coupled with an interposer disposed between the die and the socket assembly; and
a heat spreader disposed on the loading element, wherein the heat spreader forms a body having extensions disposed at opposing ends of the body and extending away from the body, wherein the extensions overlay a top surface of the profile of the loading element to couple with respective opposing portions of the loading element.

19. The system of claim 18, wherein the extensions on a first end of the body of the heat spreader and the extensions on a second end of the body of the heat spreader are in direct physical contact with opposing portions of the loading element, wherein the first end is opposite the second end, wherein the die is coupled with the heat spreader, wherein the die is electrically coupled with the interposer through a patch structure; and wherein the die is electrically coupled with socket contacts of the socket assembly through the interposer.

20. The system of claim 18, wherein:
the circuit board is a motherboard; and
the system is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

* * * * *